United States Patent

Yu

(10) Patent No.: US 9,336,993 B2
(45) Date of Patent: May 10, 2016

(54) DIGITAL PATTERN GENERATOR (DPG) FOR E-BEAM LITHOGRAPHY

(71) Applicant: Taiwan Semiconductor Manufacturing Company, Ltd., Hsin-Chu (TW)

(72) Inventor: Tsung-Hsin Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 93 days.

(21) Appl. No.: 14/191,337

(22) Filed: Feb. 26, 2014

(65) Prior Publication Data
US 2015/0243479 A1    Aug. 27, 2015

(51) Int. Cl.
| H01J 3/14 | (2006.01) |
| H01J 37/317 | (2006.01) |
| H01J 37/24 | (2006.01) |
| H01J 37/147 | (2006.01) |
| H01J 37/20 | (2006.01) |

(52) U.S. Cl.
CPC .......... *H01J 37/3174* (2013.01); *H01J 37/147* (2013.01); *H01J 37/20* (2013.01); *H01J 37/24* (2013.01); *H01J 2237/20221* (2013.01)

(58) Field of Classification Search
None
See application file for complete search history.

(56) References Cited

U.S. PATENT DOCUMENTS

| 4,568,833 A * | 2/1986 | Roelofs | H01J 37/317 250/396 R |
| 6,524,756 B1 * | 2/2003 | Wu | C03C 3/093 430/296 |
| 6,562,523 B1 * | 5/2003 | Wu | C03C 3/093 430/13 |
| 6,864,718 B2 * | 3/2005 | Yu | H03K 3/356113 326/62 |
| 7,173,472 B2 * | 2/2007 | Chen | H03K 19/018521 326/81 |
| 7,202,713 B2 * | 4/2007 | Yu | H03K 17/223 327/143 |
| 7,692,167 B1 * | 4/2010 | Mankos | B82Y 10/00 250/492.22 |

(Continued)

FOREIGN PATENT DOCUMENTS

| EP | 0092873 A2 * | 11/1983 | .......... H01J 37/3007 |
| EP | 0092873 A3 * | 8/1985 | .......... H01J 37/3007 |

(Continued)

OTHER PUBLICATIONS

Grella, Luca, Digital Pattern Generator: an electron-optical MEMS for massively parallel reflective electron beam lithography, Journal of Micro/Nanolithography, MEMS, and MOEMS; Jul.-Sep. 2013, pp. 031107-1-031107-11; vol. 12(3), downloaded from: http://nanolithography.spiedigitallibrary.org/article.aspx?articleid=1724607.

(Continued)

*Primary Examiner* — Andrew Smyth
(74) *Attorney, Agent, or Firm* — Haynes and Boone, LLP

(57) ABSTRACT

A method of lithography including providing a first mirror array and a second mirror array of a digital pattern generator (DPG); the second mirror array is offset from the first mirror array in a first direction. A first data piece and a second data piece associated with an IC device, are received by the DPG. The first and second data piece each defines a state of a pixel of the DPG. The first data piece is provided to a first pixel of the DPG. The second data piece is also provided to the first pixel of the DPG. A first point on a photosensitive layer on a target substrate is exposed. The first point is defined by the first data piece and the second data piece. The target substrate moved in a second direction, perpendicular to the first direction to expose a second point.

19 Claims, 6 Drawing Sheets

(56) References Cited

U.S. PATENT DOCUMENTS

| | | | | |
|---|---|---|---|---|
| 7,999,598 B1* | 8/2011 | Yu | H03K 17/0822 | 326/80 |
| 8,183,526 B1* | 5/2012 | Mankos | H01J 37/05 | 250/305 |
| 8,331,514 B2* | 12/2012 | Fu | H03L 7/0807 | 327/147 |
| 8,373,144 B1* | 2/2013 | McCord | G21K 1/087 | 250/396 R |
| 8,686,781 B2* | 4/2014 | Yu | H04L 25/028 | 327/306 |
| 8,724,200 B1* | 5/2014 | Wu | G02B 26/0825 | 359/224.1 |
| 8,729,935 B2* | 5/2014 | Ko | H04L 25/028 | 327/142 |
| 8,810,296 B2* | 8/2014 | Zhan | H03K 3/356 | 327/208 |
| 8,873,213 B2* | 10/2014 | Zhan | H03K 3/356113 | 327/309 |
| 8,904,326 B2* | 12/2014 | Huang | G06F 17/5036 | 716/106 |
| 8,933,425 B1* | 1/2015 | Bevis | H01J 37/153 | 250/396 R |
| 8,941,085 B2* | 1/2015 | Kuo | H01J 37/3175 | 250/396 R |
| 8,969,836 B1* | 3/2015 | Chen | G06F 17/5081 | 250/396 R |
| 8,995,597 B2* | 3/2015 | Fu | H03L 7/00 | 375/371 |
| 9,001,308 B2* | 4/2015 | Yu | H01J 37/3174 | 355/67 |
| 2004/0164766 A1* | 8/2004 | Yu | H03K 3/356113 | 326/68 |
| 2004/0232448 A1* | 11/2004 | Yu | H01L 21/76838 | 257/203 |
| 2005/0073342 A1* | 4/2005 | Yu | H03K 17/223 | 327/143 |
| 2005/0264148 A1* | 12/2005 | Maldonado | H01J 37/073 | 313/103 R |
| 2006/0158455 A1* | 7/2006 | Yoshino | H03N 13/0409 | 345/589 |
| 2009/0127473 A1* | 5/2009 | Kimura | B82Y 10/00 | 250/396 R |
| 2011/0255643 A1* | 10/2011 | Fu | H03L 7/0807 | 375/371 |
| 2012/0085919 A1* | 4/2012 | Kojima | G03F 7/70291 | 250/396 R |
| 2012/0092057 A1* | 4/2012 | Yu | H04L 25/028 | 327/309 |
| 2013/0127520 A1* | 5/2013 | Zhan | H03K 19/018521 | 327/437 |
| 2013/0241615 A1* | 9/2013 | Zhan | H03K 3/356113 | 327/208 |
| 2014/0007031 A1* | 1/2014 | Huang | G06F 17/5036 | 716/112 |
| 2014/0021995 A1* | 1/2014 | Zhan | H03K 3/356 | 327/208 |
| 2014/0091837 A1* | 4/2014 | Ko | H04L 25/028 | 327/108 |
| 2014/0097362 A1* | 4/2014 | Carroll | B82Y 40/00 | 250/492.22 |
| 2014/0140458 A1* | 5/2014 | Fu | H03L 7/00 | 375/371 |
| 2014/0268076 A1* | 9/2014 | Huff | H01J 37/3177 | 355/53 |
| 2014/0268078 A1* | 9/2014 | Kuo | H01J 37/3175 | 355/67 |
| 2015/0074627 A1* | 3/2015 | Huang | G06F 17/5036 | 716/107 |
| 2015/0077731 A1* | 3/2015 | Lin | G03F 7/70275 | 355/46 |
| 2015/0130530 A1* | 5/2015 | Chan | H03K 17/162 | 327/382 |
| 2015/0131077 A1* | 5/2015 | Kuo | H01J 37/3175 | 355/77 |
| 2015/0160568 A1* | 6/2015 | Yu | G03F 7/70491 | 355/67 |

FOREIGN PATENT DOCUMENTS

| | | | | |
|---|---|---|---|---|
| EP | 0092873 B1 * | 4/1989 | | H01J 37/3007 |
| NL | DE 3379616 D1 * | 5/1989 | | H01J 37/3007 |
| WO | WO04001508 | 12/2003 | | |
| WO | WO 2004001508 A2 * | 12/2003 | | G03F 7/70283 |
| WO | WO 2004001508 A3 * | 8/2004 | | G03F 7/70283 |

OTHER PUBLICATIONS

U.S. Appl. No. 61/781,891, filed Mar. 14, 2013, 44 pgs.
Utility U.S. Appl. No. 14/030,490, filed Sep. 18, 2013, 73 pgs.

* cited by examiner

DIGITAL PATTERN GENERATOR (DPG) FOR E-BEAM LITHOGRAPHY

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One process where advances are concentrated is lithography—lithography generally involves the patterned exposure of a photosensitive layer on a target substrate so that portions of the layer can be selectively removed to provide a masking element on the substrate. The masking layer exposes underlying areas for selective processing such as by etching, material deposition, implantation and the like. Photolithography utilizes electromagnetic energy in the form of ultraviolet light for selective exposure of the resist. As an alternative to electromagnetic energy, charged particle beams have been used for high resolution lithographic resist exposure. In particular, electron beams have been used since the low mass of electrons allows relatively accurate control of an electron beam at relatively low power and relatively high speed. Electron beam lithography system is also an effective method to scale down the feature size. However, production-level wafer throughput by the current lithography systems is a challenge in large scale fabrication in the IC industry.

Accordingly, what needed are systems and methods for increasing the wafer throughput and saving the footprint for the lithography system.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. It is noted that the term region as used herein, for example to provide an exposure region, does not necessitate any given area unless specifically described. For example, a region of a target substrate may be as defined as a e-beam exposure point.

Figure 1:
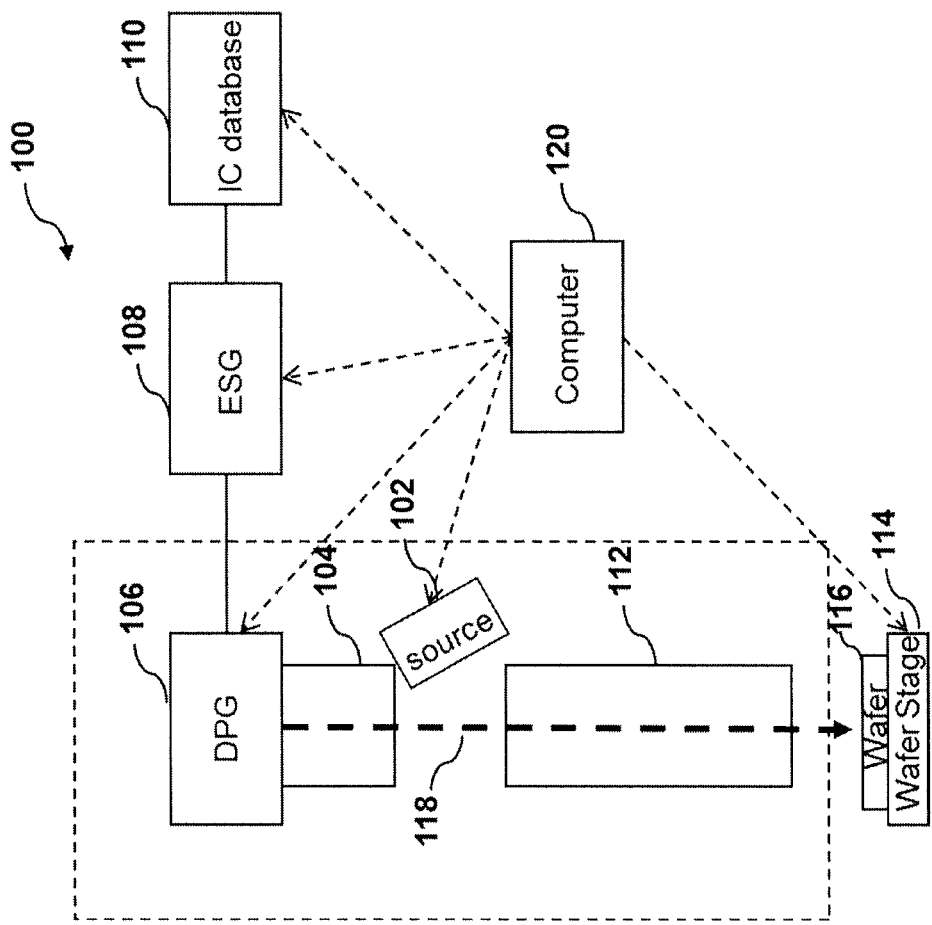
FIG. 1 is a schematic diagram of an embodiment of an electron beam lithography system according to one or more aspects of the present disclosure.

FIG. 1 illustrates a schematic diagram of an electron beam lithography system 100 according to one or more embodiments of the present disclosure. As shown in FIG. 1, the electron beam lithography system 100 includes a source 102, a condenser lens column 104, a digital pattern generator (DPG) 106, an electric signal generator (ESG) 108, an integrated circuit (IC) design database 110, a projection lens column 112, a wafer stage 114, and a wafer 116 disposed on the wafer stage 114. It is understood that other configurations and inclusion or omission of various items in the system 100 may be possible. The system 100 is an example embodiment, and is not intended to limit the present invention beyond what is explicitly recited in the claims. In an embodiment, the system 100 is a reflective electron beam lithography tool, also referred to as REBL. One example is described in further detail in *REBL Nanowriter: Reflective Electron Beam Lithography*, by Petric et al., Proc. of SPIE Vol. 7271, which is hereby incorporated by reference in its entirety.

The source 102 provides a beam, such as an electron beam or an ion beam. The source 102 may include an ion source or an electron source. In some embodiments, the electron source includes a cathode, an anode, and an aperture. The condenser lens column 104 guides the radiation beams from the source 102 to the pattern generator 106. In some embodiments, the condenser lens column 104 may include a plurality of electromagnetic apertures, electrostatic lenses, and electromagnetic lenses.

The digital pattern generator 106 may be coupled through fiber optics to an electric to optical signal converter that is coupled to the electric signal generator 108 and to the IC design database 110. In an embodiment, the pattern generator 106 includes a mirror array plate. In some embodiments, at least one electrode plate is disposed over the mirror array plate, and at least one insulator is between the mirror array plate and the electrode plate or between the electrode plates. The mirror array plate includes a plurality of "mirrors" arranged in an array of columns and rows, similar to a memory device configuration. In an embodiment, the mirrors are metallic pads of the size between nanometers and micrometers. Each pad constitutes a pixel of the DPG. The reflectivity of the mirrors or pixels is switched on and off by the electric signal (data) from the electric signal generator 108. The pattern generator 106 provides patterning radiation beams 118 according to a design layout by reflecting or absorbing a radiation beam incident each mirror. The electric signal generator 108 connects to mirrors embedded into the mirror array plate of the pattern generator 106 and to the IC design database 110. The electric signal generator 108 turns mirrors on or off according to the IC design database 110 by reflecting or absorbing a radiation beam.

The IC design database 110 connects to the electric signal generator 108, and thus the DPG 106. The IC design database 110 includes an IC design layout. In some embodiments, an IC design layout includes one or more IC design features or patterns. The IC design may define a device such as a static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The IC design layout is presented in one or more data files having the information of geometrical patterns. In some examples, the IC design layout may be expressed in a graphic database system (GDS) format. The IC design database 110 controls the electric signal generator 108 according to the IC design layout and therefore controls the pattern generator 106 to provide the patterning radiation beams 118.

The data is sent from the IC database 110. The data may be stored and/or sent as a computer file, for example, as a graphic database system (GDS) type file, as an open artwork system interchange standard (OASIS) type file, and/or as any appropriate type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools including the system 100.

The projection lens column 112 guides the patterning radiation beams 118 generated from the pattern generator 106 to the wafer 116 secured on the wafer stage 114. In some embodiments, the projection lens column 112 includes a plurality of electromagnetic apertures, electrostatic lenses, electromagnetic lenses, and deflectors. The wafer stage 114 secures the wafer 116 by electrostatic force and provides accurate movement of the wafer 116 in X, Y and Z directions during focusing, leveling, and exposing the wafer 116 in the electron beam lithography system 100. In some embodiments, the wafer stage 114 includes a plurality of motors, roller guides, and tables.

In some embodiments, a high electric potential is applied between a cathode and an anode at the source 102, which accelerates the electrons towards and through the aperture. The value of the applied electric potential determines the energy level of the electron beams leaving the aperture. The energy of the electron beams reduces as the electron beams travel toward the DPG 106. The pixels in the DPG 106 are programmed to pattern the beam. For example, as discussed above, the DPG 106 includes a CMOS-based device or chip with multiple mirror arrays and multiple pixels, each pixel being independently operable to be "on" or "off". The multiple pixels are arranged in an array; the arrays may be arranged in segments referred to herein as mirror arrays (MA). For example, when a pixel is in an "on" state, the e-beam can be directed through the pixel, also referred to as absorbed. When the pixel is in an "off" state, the e-beam may be blocked from going through the pixel, also referred to as reflected. During the lithography process, the e-beam is directed to the pattern generator, the pattern generator is controlled to independently turn on or off each pixel by a control circuit coupled with each pixel and addressing each pixel. The controlled pixel status is determined by the data from IC database 110. The pixel may be turned off/on by sending "data" to the pixel for example, applying a voltage potential to the pixel (e.g., 2V). The data sent to the mirror is also referred to herein as a data piece or bit. The "mirrors" of the mirror array may be square pads of conductive material (e.g., TiN), a lenslet structure, and/or other structures including those later developed.

The DPG 106 may include N×M number of mirror arrays, also referred to as mirror array segments. Each mirror array includes a plurality of pixels disposed in an array as discussed above. The system 100 may use the DPG 106, which has binary (on/off) pixels, to provide a gray tone exposure to provide a pattern on the substrate 116. For example, as the substrate 116 moves under the beam, the pattern of pixels on the DPG 106 shifts.

The optical column 112 forms an image reduced in size and may accelerate the electrons to reach the wafer 116 secured on the wafer stage 114. In some embodiments, the electron beam lithography system 100 is operated under a vacuum condition.

The electron beam lithography system 100 also includes a computer 120 with a processor, a memory, and an I/O interface. The computer 120 may be coupled to the source 102, the DPG 106, the ESG 108, the IC database 110, and/or the wafer stage 114, for performing one or more of the operations described herein. Some common forms of the computer readable media used in the present disclosure may include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read. These media may be used to store and/or implement the embodiments discussed herein including those of FIGS. 2-6.

Figure 2:
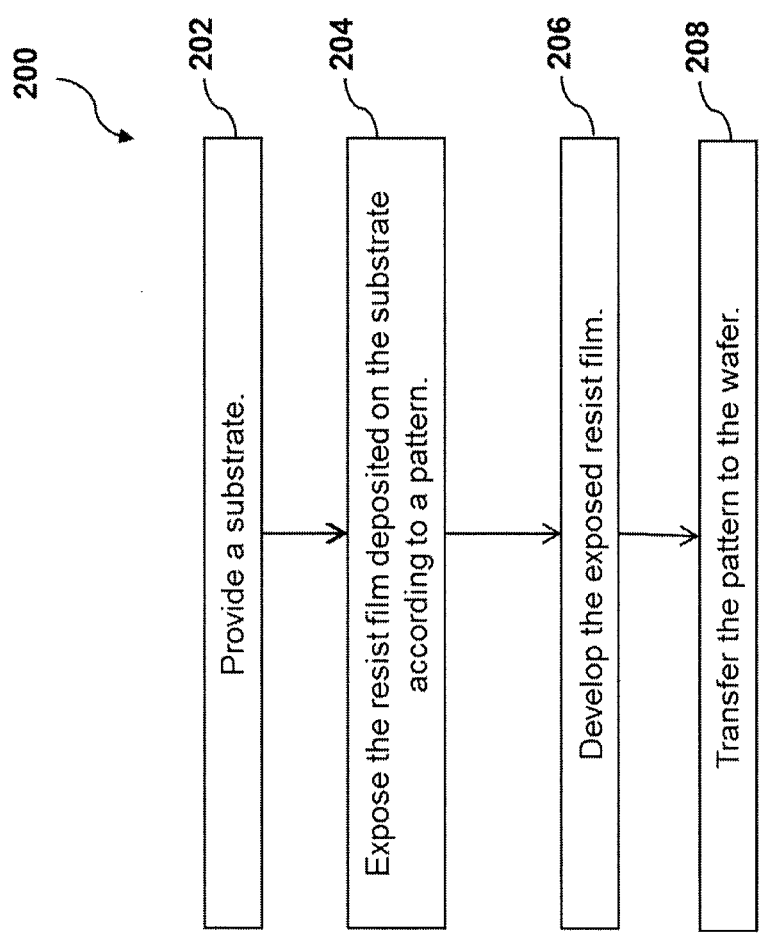
FIG. 2 is a flow chart of an embodiment of performing a lithography process that may be used to implement one or more aspects of the present disclosure.

Referring now to FIG. 2, provided is a flowchart illustrating a method 200 of forming a pattern on a substrate, such as wafer 116, using lithography system, such as lithography system 100. It is understood that additional steps can be provided before, during, and after the method 200, and some steps described can be replaced, eliminated, or moved around for additional embodiments of the method 200.

The method 200 begins at step 202 by providing a substrate. The substrate may be substantially similar to the wafer 116 described above with reference to FIG. 1. In some embodiments, the substrate may be a silicon wafer. Alternatively or additionally, the substrate may include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In an embodiment, the substrate includes a semiconductor on insulator (SOI). A plurality of conductive and non-conductive thin films may be deposited on the substrate. In an embodiment, a photosensitive layer is disposed on a top surface of the substrate. The photosensitive layer may include photoresist film and/or electron beam sensitive resist film. For example, a positive resist or a negative resist may be provided, In embodiments, the layer may be a single layer resist film or a multiple layer resist film.

The method 200 proceeds to step 204 by patterning or exposing the resist film deposited on the substrate using the lithography system 100. In some embodiment, a region of the substrate patterned by the beam may be referred to as a data grid pixel, which is defined by the patterned beam after demagnification. When the electron beam lithography system 100 is used at step 204, the pattern is decided by the pattern generator 106 of FIG. 1, and implemented using the patterning electron beam 118 provided by the pattern generator 106, as discussed with regard to FIG. 1. The provision of this pattern is discussed in further detail below with reference to FIGS. 3-6.

After providing a pattern onto the photosensitive layer, the method 200 proceeds to step 206 by developing the exposed photosensitive layer on the substrate to form a resist pattern. In some embodiments, a developer includes a water based developer, such as tetramethylammonium hydroxide (TMAH). In other embodiments, a developer may include an organic solvent or a mixture of organic solvents, such as methyl a-amyl ketone (MAK) or a mixture involving the MAK. Developer may be applied onto the exposed resist film, for example using a spin-on process. The applied developer may also be performed with a post exposure bake (PEB), a post develop bake (PDB) process, or a combination thereof. After development of the photosensitive layer, the remaining resist pattern may be referred to as a masking element.

The method 200 then proceeds to step 208 and transferring the resist pattern defined by the masking element to the substrate or layer formed thereon, for example by an etching process such as a dry (plasma) etching, a wet etching, and/or other etching methods.

During an exposure process using the lithography system 100 and/or the method 200, a wafer stage, such as the stage 114 may be moved so that various regions on a target substrate may be exposed using one exposure tool. For example, when the wafer stage 114 is moving relative to the lens 112, a first region of a wafer may be exposed along an opposite direction of the moving direction of the wafer stage in a scanning mode. After finishing exposing the first region, the wafer stage 114 may be continuously or discretely moved relative to the lens 112, so that a second region, which is different from the first region of the wafer may be exposed in the scanning mode. During the one or more "scanning" processes, the wafer stage 114 may be mobile, and the lens 112 may be stationary. In other embodiments, the beam 118 may be mobile. FIG. 2 may be implemented by the system 100 and/or the devices described below with reference to FIGS. 3-6.

Figure 3:
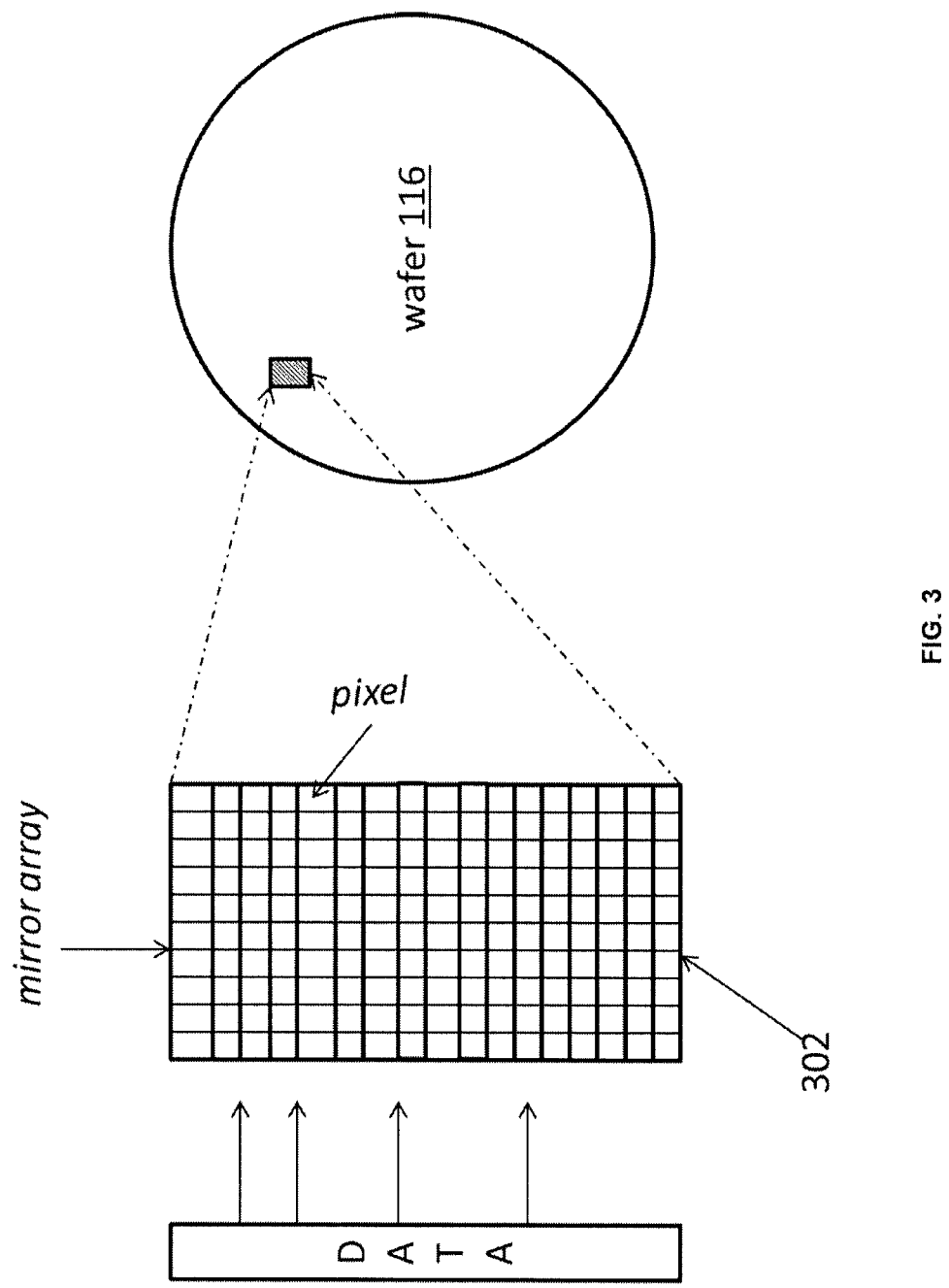
FIG. 3 is a schematic of an embodiment of a DPG used to perform a lithography process.

Referring now to FIG. 3, illustrates is an embodiment of a DPG mirror array. The mirror array 302 may in the DPG 106 of the system 100 of FIG. 1. The mirror array 302 has a "mirrors" or pixels arranged in an array defined by columns and rows. The mirror array 302 may be one segment or MA of a plurality of MAs of the DPG. The blocks may be used to provide an appropriate dose corresponding to the grayscale desired to implement the data (e.g., design data). The design data is reproduced as a pattern on the wafer 116 by providing the corresponding dose of the beam. The dose of the beam is performed by controlling the mirrors of the mirror array including the time of exposure to a given mirror and the time of exposure to a cumulative number of mirrors as the wafer and/or beam move relative to one another. To accomplish this, each pixel of the mirror array is fed with a new bit or piece of data on a continuous basis during the exposure process. For example, in an embodiment, each piece of incoming data is delayed so that the mirrors of the block it is associated with are controlled in succession. The summation of these as the projected beam is incident a moving wafer provides the appropriate dose (e.g., grayscale) for each portion of the wafer. One embodiment of a DPG mirror array is described in Grella et al., *Digital pattern generator: an electron-optical MEMS for massively parallel reflective beam lithography*, J. Micro/Nonlith. MEMS MOEMS, July-September 2013, Vol. 12 pages 031107-1-031107-10, which is hereby incorporated by reference. In an embodiment, this DPG mirror array may be used to implement the methods described below.

Figure 4:
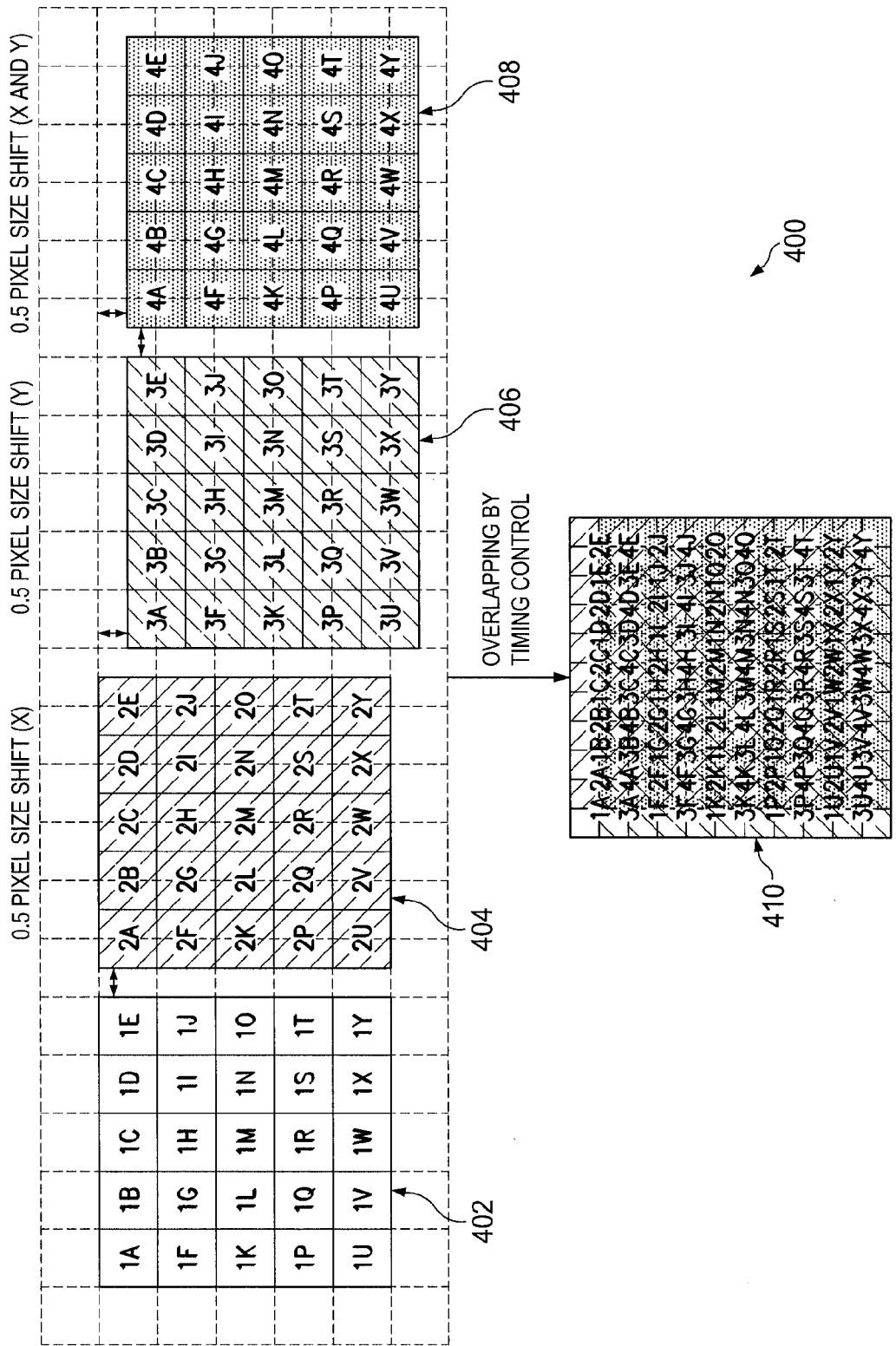
FIG. 4 is a schematic of an embodiment of using a DPG in a shifted mirror array configuration.

Referring now to FIG. 4, illustrated is a diagrammatic representation of a DPG 400 that includes a plurality of mirror arrays implementing a pixel shift method. A pixel shift method implementation of the mirror arrays may serve to increase resolution provided by the mirror array. The DPG 400 may be substantially similar to the DPG 106 described above with reference to FIG. 1 and/or the DPG of FIG. 3.

The DPG 400 as illustrated includes four segments or four mirror array (MA) illustrated as 402, 404, 406 and 408. The DPG 400 may be referred to as a 2×2 DPG. Using the context of the notation N×M discussed herein, N=2 and M=2 for DPG 400, where N is a mirror array number in the x-direction and M is a mirror array number in a y-direction. As illustrated, the mirror array 402 has a plurality of a first set of data (e.g., also referred to bits or pieces of data, which may be simply a voltage applied to the mirror, illustrated by 1A, 1B etc) delivered to each pixel the mirror array 402. Mirror arrays 404, 406, and 408 also include data delivered to the respective mirror array. It is noted that mirror array 404 is shifted in the x-direction from mirror array 402. Specifically, it is shifted 0.5 pixel (or half a pixel distance) in the x-direction. A hashed grid is provided in FIG. 4 for illustration of the shifting of the mirror arrays. Similarly, mirror array 406 is shifted in the y-direction from mirror array 402 by 0.5 pixel. The mirror array 408 is shifted in both the x-direction and the y-direction by 0.5 pixel from the mirror array 402. Like the number of mirror arrays, the shift of the mirror arrays as illustrated (e.g., 0.5 shift in a direction) is exemplary only and any degree of shift may be possible.

Illustrated by element 410 of FIG. 4 is the produced exposure using the mirror arrays 402, 404, 406, and 408. As illustrated by resultant pattern 410, each of the mirror array 402, 404, 406, 408 acts upon a region of a target substrate. In other words, the element 410 illustrates a cumulative dose of the modulated beam seen by a region of a target substrate. The cumulative exposure 410 is an overlapping of each of mirror arrays 402, 404, 406, and 408 incident the target substrate. In an embodiment, the cumulative exposure 410 is provided on a region of a photosensitive layer on a substrate, such as the wafer 116 of FIG. 1 and/or the substrate described above with reference to block 202 of FIG. 2. (It is noted that the exposure if provided one 'point' by one 'point' on the substrate.) The illustration of element 410 shows the benefits of the pixel shift methodology. The shift of the mirror arrays allows for increased resolution for the target substrate (e.g., decreased effective pixel size). See, for example, the resultant pattern 410 where each region of the target (i.e., defined by the pixel size of the DPG) is partitioned into various segments (e.g., 4) based on the shift of the original mirror arrays 404, 406, 408. These segments may be effective pixel regions each having separately controlled and defined exposure. In an embodiment, by implementing the shifts of states 404, 406, and 408 (i.e., a 4× shift pattern) a 2× resolution improvement for the mirror array can be seen. In an embodiment, this may be shown as an $N^2$ mirror array can get an N resolution improvement. For example, $2^2=4$ mirror array with 1 µm pixel size is equivalent to an effective pixel size of ½=0.5 µm pixel size. As another example, $3^2$=9 mirror array with 1 µm pixel size is equivalent to an effective pixel size of ⅓=0.33 µm pixel size. However, it is noted that the area, routing signal, and power are also increased as $N^2$.

Figure 5:
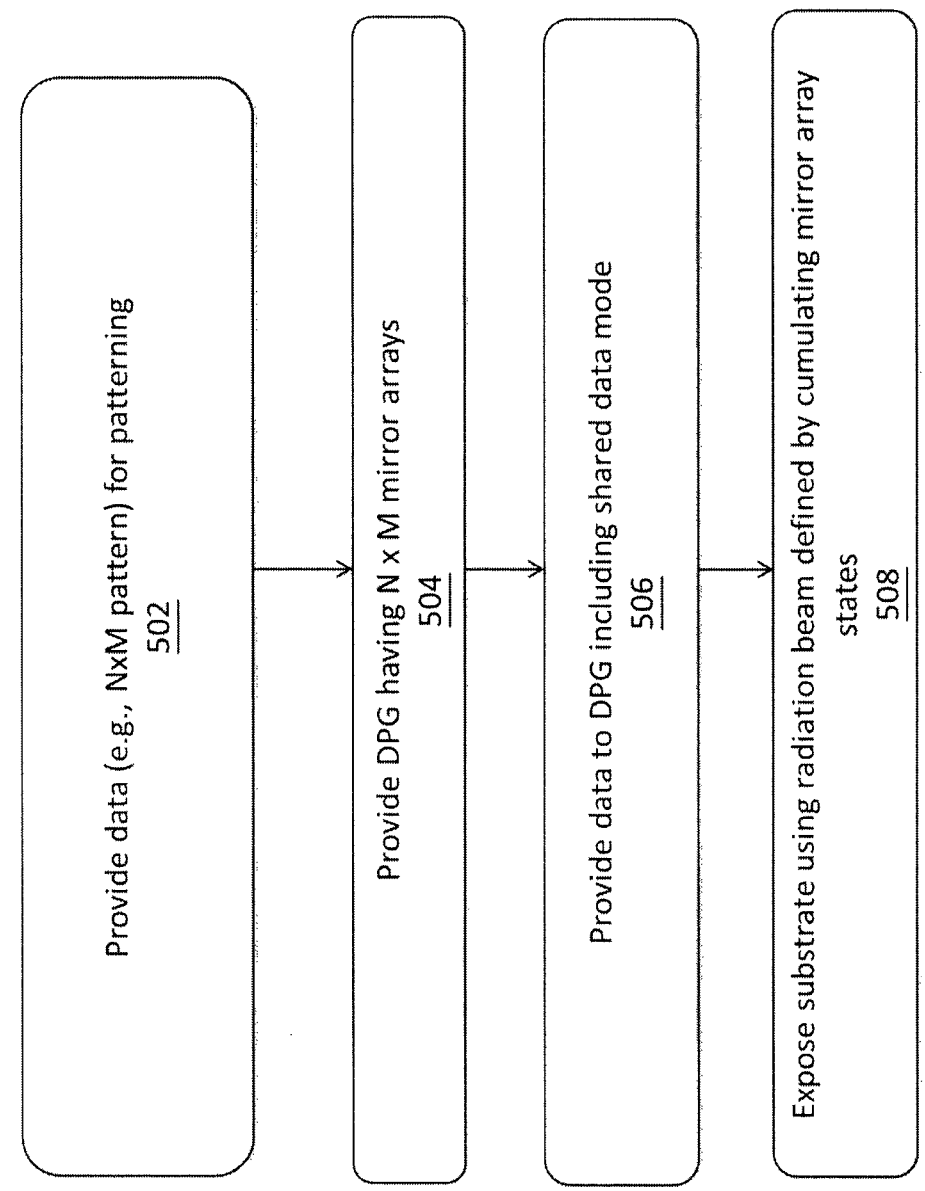
FIG. 5 is a flow chart of an embodiment of a method of lithography including providing and programming a DPG mirror array according to one or more aspects of the present disclosure.

Referring now to FIG. 5, illustrated is a method 500 for providing data to a digital pattern generator. The method 500 may be used with the system 100, described above with reference to FIG. 1, the method 200, described above with reference to FIG. 2, and/or the DPG 302 described above with reference to FIG. 3.

The method 500 begins at block 502 where a pattern of data (pieces) is provided. The pattern may be suitable for an N×M configuration of mirror arrays. See FIG. 4 above. It is noted that the method 500 discusses block 502 and the presentation of the pattern as an N×M array pattern for ease of understanding. The data set may be referred to as $N_{data} \times M_{data}$ or $N_d \times M_d$. However, it is not necessary for the method 500 for the data to be presented in the indicated array form. For example, in other embodiments, block 502 is omitted and data is presented in another form. The data may be determined based on the target pattern for the integrated circuit to be generated on a target substrate. For example, the data may be generated using an IC database such as the IC database 110, described above with reference to FIG. 1.

The method 500 then proceeds to block 504 where a DPG is provided. In an embodiment, the DPG includes a plurality of mirror arrays (MA) or mirror array segments. In an embodiment, the DPG includes N×M mirror arrays where N is the number of mirror arrays in an x-direction and M is a number of mirror arrays in a y-direction. The DPG may be configured such that the scan direction is in the x-direction, as discussed herein. However, other scan directions are possible.

In an embodiment, the DPG provided has a configuration of mirror array numbers (N×M) where N=1 and M is equal to a number greater than one. In such an embodiment, the DPG is operable to accept $N_d \times M_d$, where $N_d$ is greater than 1, as described in further detail below. It is noted that as discussed herein the terms "x" and "y" directions are used for illustrative purposes only and indicative only of a relative direction and may be reversed in any of the embodiments discussed herein. Additionally, the directions may be referred to with reference to the scan direction (x in the present example is the scan direction, and perpendicular scan direction, y in the present example).

Figure 6:
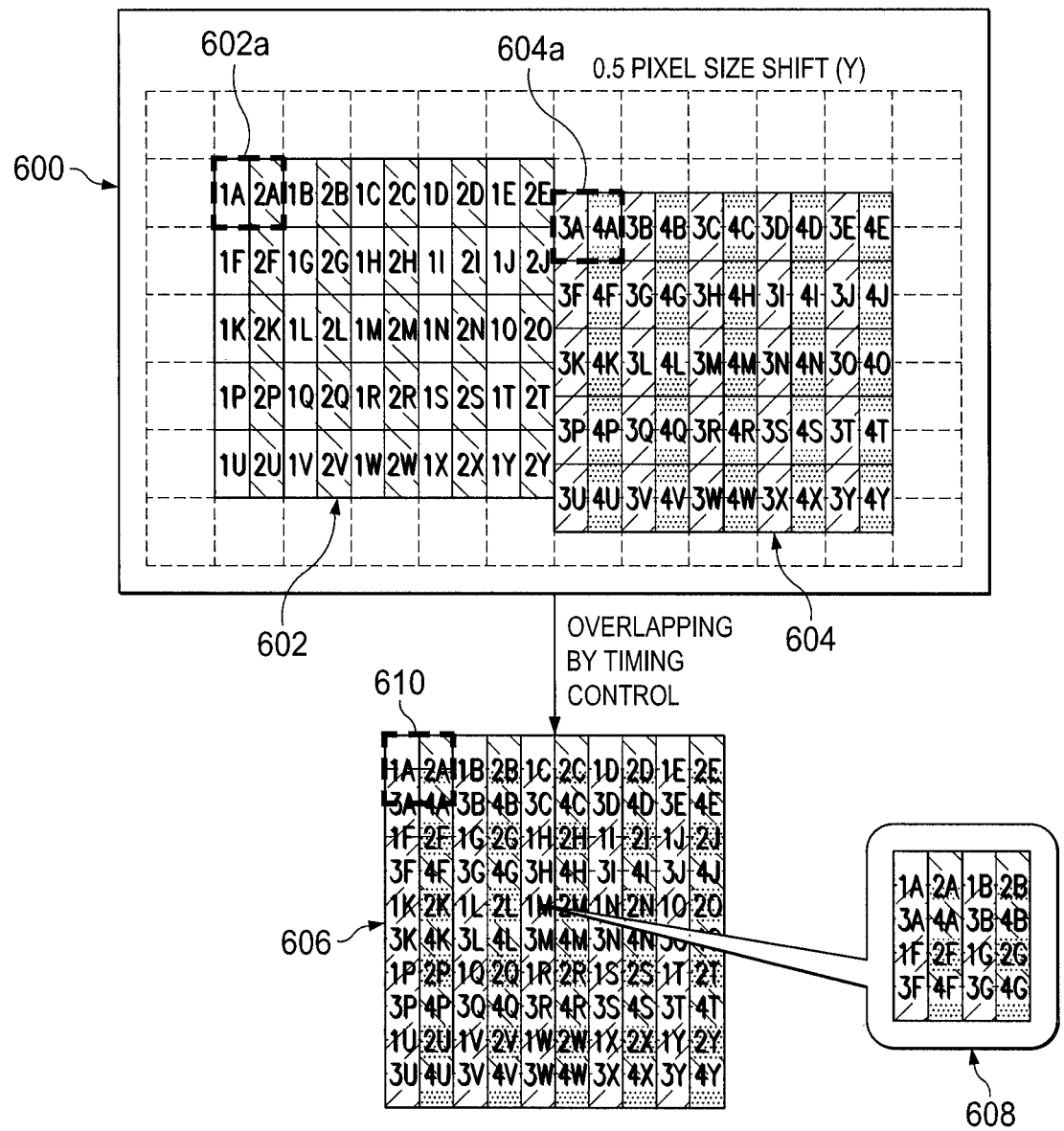
FIG. 6 is a schematic of an embodiment of a DPG including programming the DPG in a shared data mode according to one or more aspects of the present disclosure.

In an embodiment of block 504, the DPG includes M mirror array in the y-direction, where M is greater than 1. In an embodiment, each of the M mirror arrays may be shifted from one another as described above with reference to FIG. 4. The shift may be any pixel fraction in the y-direction. FIG. 6 is illustrative of a DPG 600 having an N×M mirror array configuration where N=1 and M=2. Specifically, the exemplary DPG 600 includes two MA in the y-direction (M is equal to two). The second mirror array 604 is shifted from the first mirror array 602 by 0.5 pixel in the y-direction. It is noted that this is exemplary only and not intended to be limiting, for example, in embodiments, M may be any number. In embodiments, the shift in the y-direction may be any fraction of a pixel. As but one other example, in an embodiment M is equal to three mirror arrays and a shift of ⅓ of a pixel in the y-direction is provided by each of the M mirror arrays.

As discussed above, the DPG provided in block 504 of the method 500 has N number of MA in the x-direction. In an embodiment, N is equal to 1. This embodiment is illustrated by the DPG 600 of FIG. 6. The DPG 600 does not include a mirror array shifted in the x-direction. In an embodiment, the x-direction is the scan direction. Rather, data (e.g., Nd), or scan direction may be shared by a single pixel as discussed with reference to block 506 below.

The method 500 then proceeds to block 506 where the data is provided to the DPG and mirror arrays discussed above with reference to block 504. In an embodiment, the data is a data set having a piece of data for each pixel of MA of an N×M configuration, the data referred to herein as Nd (data for N mirror arrays in the x-direction) and Md (data for M mirror arrays in the y-direction), where Nd and Md are greater than 1. However, in contrast to FIG. 4, the data may be delivered to a DPG having a configuration of mirror arrays of N×M where N is less than Nd, such as N=1. The data is delivered such that multiple pieces of data "share" one or more pixels of a mirror array. This allows less MA for receiving the same amount of data. The sharing may be accomplished by increasing the signal frequency of delivering the data to the mirror array(s) or decreasing the scan speed such that the relation between the scan speed and the frequency provide for a single pixel of the DPG to exhibit two or more states defined different data pieces during a scan of the pixel of the DPG. This may be referred to herein as a "shared data mode" operation of the DPG and/or mirror arrays such that at least one pixel of the DPG is used to provide two different data points to a single region on the target substrate. (A single region on the target substrate is a region of the substrate defined by the size of the pixel of the DPG, after demagnification. This is also referred to as a region of a data grid.) It is noted that the exposure on the substrate is substantially a point exposure, however, for ease of reference the region corresponding to the pixel size of the DPG after demagnification is referred to herein as region in which multiple data pieces are used to define the exposure (points).

In other words, in a shared data mode, data from the set of data (Nd) in x-direction is "filled in" to the mirror array in order. As one example, the DPG has N=1 mirror array in the x-direction and Nd=2, the data typically configured for the second MA is instead "filled in" to the single mirror array by time-sharing the pixel. (Again, in an embodiment, the x-direction is the scan direction). This configuration is illustrated by FIG. 6, discussed below. Using FIG. 4 as a comparison, the data from a second MA that shares the same Y-position as a first MA is merged or shares a single pixel of the first MA, eliminating the need for a second MA to contain that piece of data. For example, in FIG. 6 a single mirror array 602 includes the data provided to two different mirror arrays 402, 404 of FIG. 4 because the mirror array 402, 404 share the same y-position. Similarly, the mirror array 604 of FIG. 6 holds the data of both mirror array 406, 408 of FIG. 4. As discussed herein the data in mirror array 602 shares the pixel by occupying the pixel for ½ t; while the data in 402, 404 occupies the respective pixel for t. "t" is a unit of time.

In an embodiment, the frequency of data delivery to a pixel of the DPG and the scan speed of the operation (e.g., scan speed of the target substrate) must have a defined relationship in order to expose a pixel region of the target substrate. In order to effectuate the shared data mode of operation of the DPG discussed herein, at least two pieces of data are delivered to a given pixel of the DPG during the time it takes to scan the given pixel. In an embodiment, while scanning the DPG in a first direction during the lithography process a scan speed of S/T is used. S is the pixel dimension in the first direction and T is a time to scan over the full length S of the pixel. The data is delivered to the pixel at a frequency of F. In an embodiment, the magnitude of frequency F is such that during the time T, at least two pieces of data are delivered to the pixel. Thus, in an embodiment, the signal frequency F is greater than 1/T. In an embodiment, the signal frequency is 2×1/T. In another embodiment, the signal frequency is 3×1/T. However, any signal frequency that provides more than one piece of data during time T is within the scope of this disclosure.

Referring now to the device of FIG. 6 in detail, illustrated is a DPG 600 of N×M size, where N=1 and M=2. The DPG 600 is exemplary only and not intended to be limiting to any quantity of MA or number of data pieces sharing a given pixel. The DPG 600 includes a mirror array 602 and a mirror array 604. The mirror array 604 is shifted in the y-direction from the mirror array 602. In an embodiment, the shift is 0.5 pixel. It is noted that there is no shift in the x-direction (e.g., scan direction); however, other embodiments of the physical configuration of the DPG are possible including additional quantities of MA, different shift directions, different shift amounts, etc.

As illustrated in FIG. 6, a pattern of data that includes data for pixels of mirror arrays of 2×2 MA DPG is provided to the DPG 600, of in other words, data of Nd=2 and Md=2 size is provided. The data pieces are illustrated as a #letter (e.g., 1A, 3B, etc). The data may be determined from IC data generated as a computer file, for example, as a graphic database system (GDS) type file, as an open artwork system interchange standard (OASIS) type file, and/or as any appropriate type file. The GDS or OASIS files are database files used for data exchange of IC layout artwork, the layouts may be transferred into a pattern defining the layout using a mirror array. In an embodiment, the data includes a definition of the state of mirrors of the array (e.g., on or off, reflective or not) for example, provided by applying a voltage to the pixel or mirror.

While the data illustrated in FIG. 6 is of the size Nd=2, Md=2, the DPG mirror array number itself is reduced in size. The DPG 600 has a mirror arrays 602, 604 that are in an N×M array where N=1 and M=2. Two different pieces of data are delivered to each pixel of each of the MA 602 and 604, illustrated as a data piece on the left and right of a pixel. For example, data 1A and 2A "share" pixel 602a of the MA 602. It is noted that the "sharing" is temporal, in that data 1A occupies pixel 602a for a first time, data 2A occupies pixel 602a for a second time. The second time may immediately follow the first In an embodiment, the sharing is accomplished by increasing (e.g., doubling) the frequency of delivering data to the pixel as discussed above. In another embodiment, the sharing is accomplished by decreasing the scan speed of the process. This is compared to FIG. 4 where the data 1A and 2A are each provided to different MAs shifted in the x-direction (see 402 and 404 of DPG 400). Similarly, data 3A and 4A share pixel 604a of the MA 604 during a single scan time. Thus, FIG. 6 illustrates a DPG that images a pattern by merging two pieces of data such that they share a pixel (see, e.g., 1A and 2A) in the x-direction or scan direction. In other embodiments, any number of pieces of data can share the same pixel during a scan of the pixel.

The configuration illustrated by FIG. 6 and the accompanying description of FIG. 5 also makes is possible reduce the number of mirror arrays and thus, reduces the routing signals of the DPG. For example, two pieces of data share a same data line to a single pixel.

The method 500 of FIG. 5, then proceeds to block 508 where the substrate is exposed by the pattern of radiation created by the DPG and defined by the data as discussed above in block 506. The exposure and the target substrate may be substantially similar to as discussed above with reference to FIG. 1.

Illustrated by element 606 of FIG. 6 is the produced pattern using the methodology discussed above. Element 606 is a cumulating result of the data pieces of mirror arrays 602 and 604. In other words, the element 606 illustrates a cumulative dose of the modulated beam seen by a target such as a target substrate. In an embodiment, the cumulative exposure 606 is provided on a region of a photosensitive layer on a substrate, such as the wafer 116 of FIG. 1 and/or the substrate described above with reference to block 202 of FIG. 2, after demagnification. The element 608 illustrates a magnified region of the element 606. Region 610 is a region of the data grid of the substrate and corresponds to a pixel size of the DPG (before demagnification). Region 610 illustrates that for a given region of the resultant pattern on the target substrate, the region is defined by the overlap of data provided by the time control. For example, the region 602a defines the region on the substrate, which includes with the upper portion of region 604a overlaid. The region 610 illustrates a point at the center of which (1A/2A/3A/4A) is an exposure point.

The illustration of element 606 shows a benefit of the shared data methodology by increasing the frequency of providing the data. By implementing this methodology, an Nd=2 and Md=2 set of data can be reduced to a 1×2 mirror array number (compare FIGS. 4 and 6). Furthermore, routing signals in FIG. 6 (in comparison with FIG. 4) are reduced.

Thus, what are provided are methods and devices that allow for an increase in the frequency of a given mirror array pixel to write data on the wafer. In other words, the frequency of the data delivery to the pixel of the DPG is increased, while the scan speed is maintained. Or conversely, the scan speed is decreased relative to the frequency of data delivery. This allows a reduced number of MA and thus area, to write the same data onto a substrate. For instance, one or more pieces of data are provided to the pixel of the mirror array during the scanning of that pixel for exposure of a target substrate. As a result, for example, a mirror array may 1×M to write data of Nd×Md size. It is noted that the size 1 in the x-direction (scan direction) is exemplary only. The methods and systems discussed above can also implement a shift in the x-direction (e.g., as illustrated in FIG. 4) in addition to the sharing of data in each of the MA of the x-direction.

As illustrated above, in an embodiment, a mirror array that is N×M may be reduced to 1×M, while providing the same resolution using the decreased exposure period by a factor of N. In one embodiment, a mirror array having N=3 and M=3 may be reduced from 9× to 3×. In a further embodiment, routing signals are also reduced from N×M quantity to 1×M quantity. Extending on the previous example, from 9× to 3×. As further illustrated above, embodiments of the methods discussed herein including, for example, the shared data mode allow for reducing a critical dimension (CD) by a factor n where n<1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Thus, in one embodiment, describes a method that includes providing first data piece and a second data piece associated with an integrated circuit (IC) device. The first and second data piece each defines a state of a pixel of a digital pattern generator (DPG). The first data piece is provided to a first pixel of the digital pattern generator (DPG). The second data piece is provided to the first pixel of the DPG. Further, a point of a target substrate is exposed using radiation beam defined by the first and second data pieces.

In another of the embodiments, a method of lithography includes providing a digital pattern generator (DPG) having a first mirror array and a second mirror array. The second mirror array is shifted from the first mirror array in a first direction. The DPG is programmed to provide a patterned beam. The programming includes providing a first data piece to a first pixel of the first mirror array; providing a second data piece to the first pixel of the first mirror array; providing a third data piece to a first pixel of the second mirror array; and providing a fourth data piece to the first pixel of the second mirror array. A patterned beam is provided by the programming and delivered to a substrate, wherein the point defined on the substrate is defined by each of the first, second, third, and fourth data pieces.

In another embodiment, a method of lithography is provided. A DPG is provided that has a first pixel. The DPG is scanned in a first direction during a lithography process with a scan speed of S/T, while sending a data signal to the DPG. The data signal has a signal frequency of greater than 1/T. S is the pixel dimension in the first direction and T is a time to scan over the full dimension S of the pixel.

In a further embodiment, the patterned beam exposes a pixel of the substrate. This pixel includes: a first portion defined by the first data piece; a second portion defined by the second data piece; a third portion defined by the first data piece and the third data piece; and a fourth portion defined by the second data piece and the fourth data piece.

In yet another of the broader embodiments, provided is an apparatus including a computer readable medium that stores a plurality of instructions for execution by at least one computer processor. The instructions are for receiving a plurality of data defining states for pixels in a plurality of mirror arrays oriented in an x-direction and a y-direction; determining a data delivery frequency that is greater than the inverse of the time for scanning a pixel of the DPG.

In one embodiment, a method of lithography is provided that includes providing a first mirror array and a second mirror array of a digital pattern generator (DPG). The second mirror array is offset from the first mirror array in a first direction (e.g., perpendicular a scan direction). A first data piece and a second data piece associated with an integrated circuit (IC) device are received. The first and second data piece each defines a state of a pixel of the DPG. The first data piece is sent to a first pixel of the DPG and the second data piece is then sent to the first pixel of the DPG (e.g., subsequent and immediately following the first piece.) A first point on a photosensitive layer on a target substrate is exposed; the first point is defined by the first data piece and the second data piece. During the method of lithography, the target substrate is moved in a second direction, perpendicular to the first direction to expose a second point.

In a further embodiment, the DPG is scanned in the second direction during the method of lithography with a scan speed S/T while sending the first and the second data pieces to the DPG with a signal frequency greater than 1/T, wherein S is the first pixel length in the first direction and T is a time to scan the first pixel length S.

In another further embodiment, the providing the first data piece and the providing the second data piece is performed through a single data line to the first pixel of the DPG.

In another broader embodiment, an electron beam lithography system is provided that includes a digital pattern generator (DPG). The DPG includes a plurality of mirror arrays, wherein each of the plurality of mirror arrays is offset only in a first direction, and each of the plurality of mirror arrays are not offset in a second direction. The system also includes a wafer stage operable to move a target substrate in a second direction, perpendicular the first direction.

In a further embodiment, this plurality of mirror arrays consists of two, and only two, mirror arrays. In an embodiment, the offset in the first direction is a distance of ½ of a pixel of one of the plurality of mirror arrays. In an embodiment, the DPG includes three mirror arrays (and in a further embodiment only three arrays). In such an embodiment, the offset in the first direction is a distance of ⅓ of a pixel of one of the plurality of mirror arrays.

What is claimed is:

1. A method of lithography, comprising:
   providing a first mirror array and a second mirror array of a digital pattern generator (DPG), wherein the second mirror array is offset from the first minor array in a first direction;
   receiving a first data piece and a second data piece associated with an integrated circuit (IC) device, wherein the first and second data piece each defines a state of a pixel of the DPG;
   sending the first data piece to a first pixel of the DPG;
   sending the second data piece to the first pixel of the DPG;
   during the sending the first data piece and the sending the second data piece, scanning the DPG, wherein the scanning includes scanning the first pixel for a time T, and wherein the first data piece is held in the first pixel for a time T2 and the second data piece is held in the first pixel for a time T3, wherein a sum of T2 and T3 is less than or approximately equal to time T;
   exposing a first point on a photosensitive layer on a target substrate, wherein the first point is defined by the first data piece and the second data piece; and
   moving the target substrate in a second direction, perpendicular to the first direction to expose a second point.

2. The method of claim 1, wherein the scanning the DPG is in the second direction with a scan speed S/T while sending the first and the second data pieces to the DPG with a signal frequency greater than 1/T, wherein S is the first pixel length in the first direction and T is the time to scan the first pixel length S.

3. The method of claim 1, further comprising:
   providing a third data piece to a second pixel of the DPG, the first pixel being disposed on the first mirror array and the second pixel being disposed on the second minor array; and
   wherein the exposure of the first point is also defined by the third data piece.

4. The method of claim 1, wherein the second mirror array is shifted a distance of a half a pixel length from the first minor array.

5. The method of claim 1, wherein the first direction is a y-direction.

6. The method of claim 1, wherein the time T3 for the second data piece occurs immediately subsequent the time T2.

7. The method of claim 1, wherein the providing the first data piece and the providing the second data piece is performed through a single data line to the first pixel of the DPG.

8. The method of claim 1, further comprising:
   scanning the DPG in the second direction with a scan speed S/T while sending a third data piece and fourth data piece to the first pixel with a signal frequency greater than 1/T, wherein S is the pixel dimension in the first direction an T is the time to scan over full dimension S of the pixel.

9. A method of operating an electron beam lithography system, comprising:
provide a set of data having a size Nd×Md, wherein Md is greater than 1 and Nd is greater than 1, wherein the set of data includes a first data piece and a second data piece;
providing a digital pattern generator (DPG), wherein the DPG includes a plurality of mirror arrays providing a DPG of size Na×Ma arrays, wherein each of the Na×Ma arrays is offset only in a first direction, and each of the Na×Ma arrays are not offset in a second direction, wherein Nd is equal to Na and Md is greater than Ma, and wherein the plurality of mirror arrays includes a first pixel; and
providing a wafer stage operable to move a target substrate in a second direction, perpendicular the first direction;
sending the first data piece to a first pixel of the DPG;
sending the second data piece to the first pixel of the DPG;
during the sending the first data piece and the sending the second data piece, scanning the DPG, wherein the scanning includes scanning the first pixel for a time T, and wherein the first data piece is held in the first pixel for a time T2 and the second data piece is held in the first pixel for a time T3, wherein a sum of T2 and T3 is less than or approximately equal to time T; and
exposing a first point on a photosensitive layer on the target substrate disposed on the wafer stage, wherein the first point is defined by the first data piece and the second data piece.

10. The method of claim 9, Na is one and Ma is two mirror arrays.

11. The method of claim 9, wherein the offset in the first direction is a distance of ½ of a pixel of one of the plurality of mirror arrays.

12. The method of claim 9, wherein the DPG includes three minor arrays, such that Na is one and Ma is two, and wherein the offset in the first direction is a distance of ⅓ of a pixel of one of the plurality of minor arrays.

13. The method of claim 9, further comprising:
a single data line connected to a first pixel of a first minor array of the plurality of mirror arrays.

14. A method for a lithography process for reducing a critical dimension (CD) by a factor n wherein n<1, comprising:
providing a digital pattern generator (DPG); and
scanning the DPG in a first direction during the lithography process with a scan speed S/T such that a first pixel of the DPG has a full dimension S that is scanned in time T, while scanning sending a data signal to the DPG with a signal frequency greater than 1/T, such that a first data piece and a second data piece are delivered and occupy the first pixel during the time T, wherein the scanning includes:
sending the first data piece to the first pixel;
sending the second data piece to the first pixel;
and wherein the first data piece is held in the first pixel for a time T2 and the second data piece is held in the first pixel for a time T3, wherein a sum of T2 and T3 is less than or approximately equal to time T; and
exposing a first point on a photosensitive layer on a target substrate, wherein the first point is defined by the first data piece and the second data piece.

15. The method of claim 14, wherein the signal frequency is 2* 1/T.

16. The method of claim 14, wherein the signal frequency is 3* 1/T.

17. The method of claim 14, wherein the first direction is an x-direction.

18. The method of claim 14, wherein the providing the DPG includes configuring a first minor array and a second mirror array, wherein the second mirror array is offset from the first mirror array in a second direction, perpendicular the first direction.

19. The method of claim 14, further comprising:
providing a third data piece to the first pixel of the DPG during the time T.

* * * * *